United States Patent
Lewandowski et al.

(10) Patent No.: US 10,833,241 B1
(45) Date of Patent: Nov. 10, 2020

(54) THERMALIZATION STRUCTURE FOR CRYOGENIC TEMPERATURE DEVICES

(71) Applicant: International Business Machines Corporation, Armonk, NY (US)

(72) Inventors: Eric Peter Lewandowski, White Plains, NY (US); Bucknell C. Webb, Ossining, NY (US); Jared Barney Hertzberg, Yorktown Heights, NY (US); Martin O. Sandberg, Ossining, NY (US); Oblesh Jinka, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/447,017

(22) Filed: Jun. 20, 2019

(51) Int. Cl.
| | |
|---|---|
| *H01L 39/16* | (2006.01) |
| *H01L 39/24* | (2006.01) |
| *H01L 39/02* | (2006.01) |
| *G06N 10/00* | (2019.01) |
| *H01L 23/367* | (2006.01) |
| *H01L 23/488* | (2006.01) |

(52) U.S. Cl.
CPC ........... *H01L 39/249* (2013.01); *G06N 10/00* (2019.01); *H01L 23/3672* (2013.01); *H01L 23/488* (2013.01); *H01L 39/2493* (2013.01)

(58) Field of Classification Search
CPC . H01L 21/4878; H01L 21/7882; H01L 23/36; H01L 23/367; H01L 23/3672; H01L 23/46; H01L 23/467; H01L 39/025; H01L 39/22; H01L 39/223; H01L 39/249; H01L 39/2493
See application file for complete search history.

(56) References Cited

U.S. PATENT DOCUMENTS

| | | | |
|---|---|---|---|
| 4,252,263 A | 2/1981 | Houston | 228/193 |
| 4,798,931 A | 1/1989 | Hess, III | |
| 5,500,503 A | 3/1996 | Pernicka et al. | 219/121.64 |
| 8,736,048 B2 | 5/2014 | Schultz | |
| 10,141,493 B2 | 11/2018 | Tuckerman | H01L 39/143 |
| 2006/0005944 A1* | 1/2006 | Wang | H01L 35/32 165/80.3 |
| 2007/0068656 A1 | 3/2007 | Lee et al. | 165/104.26 |
| 2007/0159799 A1* | 7/2007 | Dando, III | H01L 23/433 361/709 |
| 2013/0196855 A1 | 8/2013 | Poletto et al. | 505/170 |
| 2013/0214406 A1 | 8/2013 | Schultz | 257/713 |
| 2017/0178018 A1 | 6/2017 | Tcaciuc et al. | H03H 3/00 |
| 2018/0102470 A1 | 4/2018 | Das et al. | H01L 25/167 |
| 2018/0152016 A1* | 5/2018 | Honda | H01B 12/16 |
| 2019/0027800 A1 | 1/2019 | El Bouayadi et al. | H01P 3/08 |

FOREIGN PATENT DOCUMENTS

CN 102728950 A 10/2012 ............. B23K 26/18

* cited by examiner

*Primary Examiner* — David C Spalla
(74) *Attorney, Agent, or Firm* — Garg Law Firm, PLLC; Rakesh Garg; Keivan Razavi

(57) ABSTRACT

A thermalization structure is formed using a foil and a low temperature device (LTD). The foil includes a first layer of a first material. The LTD includes a surface from which heat is transferred away from the LTD. A coupling is formed between the foil and the surface of the LTD, where the coupling includes a bond formed between the foil and the surface such that forming the bond forms a set of ridges in the foil, a ridge in the set of ridges operating to dissipate the heat.

25 Claims, 10 Drawing Sheets

THERMALIZATION STRUCTURE FOR CRYOGENIC TEMPERATURE DEVICES

TECHNICAL FIELD

The present invention relates generally to a cooling apparatus for semiconducting or superconducting chips. More particularly, the present invention relates to thermalization structure for cryogenic temperature devices.

BACKGROUND

A "low temperature" range, as used herein, refers to a cryogenic temperature range, which starts at or about 77 degrees Kelvin (K) or lower, and down to at least 1 millikelvin (0.001 K), and in some cases as low as practicable, e.g., to 0.000001 K using presently available technology. A "low temperature" is a temperature in the cryogenic temperature range. A semiconductor or superconductor device operating in a cryogenic temperature range is referred to herein as a low temperature device (LTD). Semiconducting device, and/or superconducting devices, produce heat when operating. LTDs operating in a cryogenic temperature range also produce heat while operating, but the heat removal poses unique challenges in low temperature operations.

Most devices operating at cryogenic temperatures rely on materials that exhibit superconducting properties at those temperatures. Most superconductors are not good thermal conductors. To be able to remove heat from a structure, a material has to be a good thermal conductor. For a material to be regarded as a good thermal conductor, the material must exhibit at least a threshold level of thermal conductivity. For example, a thermal conductivity of greater than a 1 Watt/(centimeter*K) at 4 Kelvin, is an acceptable threshold level of good thermal conductivity according to the illustrative embodiments.

Thermalization of a structure is the process and apparatus to conduct heat to or from the structure. Thermalization of a structure often requires a good thermal conductor physically attached to the structure for heat conduction to/from the structure, as the need may be. E.g., when a heat producing LTD has to be thermalized, a good thermal conductor, e.g., a heat sink fashioned from Copper, Silver, Gold, or another known good thermal conductor, is physically attached to the LTD to remove the heat from the LTD.

The illustrative embodiments recognize that good thermalization is achieved when the structure is attached to the thermal conductor in a compressive metal-to-metal contact. Good thermalization therefore also necessitates considerable mechanical force to attach compression-fitting heat sinks onto the devices.

Many low temperature devices (LTD, LTDs) are dimensioned in only a few micrometers to few millimeters along each side, and comprise fragile chips fabricated on/in a substrate material. Applying force to fit heat sinks onto an LTD is necessary but problematic under the presently available solutions. In many cases, the force applied to the device to fit a tight-fitting heat sink can cause damage to the device, or worse destroy the device.

Some low LTDs comprise of more than one chip coupled to each other via fragile cold welds, e.g., using soft solder material. For example, a quantum processor can be fabricated in a flip-chip configuration in which one chip—an interposer chip comprising readout circuitry with connection points—is flipped over onto a second chip—a qubit chip comprising qubits and contact pads—such that the connection points and the contact pads are aligned and facing each other. The connection points on the interposer are cold welded to the contact pads on the qubit chip using a soft solder material. The cold welding holds the interposer at a predetermined distance from the qubit chip to produce certain electrical characteristics in the resulting quantum processor. The distance between the chips in a flip-chip configuration is an important factor in the correct operation of the flip-chip configuration.

The illustrative embodiments recognize that applying compressive force, e.g., to press a constant force mounting heat sink onto a flip-chip device, can be devastating to the functioning of the chip. Because the soft solder material holding the two chips in position relative to each other is designed to be pliable, any application of force to one of the chips can cause creeping or deformity in the soft solder, resulting in inadvertent change in the separation distance between the chips. While this type of damage is possible quite readily with flip-chips, the chips in the flip-chip configuration also remain susceptible to physical damage from the force to fit a heat sink onto a chip.

The illustrative embodiments further recognize that even when the heat sink is compression fitted to a chip without significant damage to the chip, the materials of the heat sink, the thermal conduction structures on the chip, or both, are such that once the heat sink has been fitted, if the heat sink is mounted at a constant height, the solder material creep will cause a decrease in the contact force with which the heat sink attaches to the chip. Thus, the illustrative embodiments recognize that maintaining good thermalization of devices with the presently available methods is problematic where the thermalization structures are coupled with the LTDs in both—constant force mounting as well as constant height mounting arrangements.

LTDs devices such as qubits, quantum processors, and certain low temperature flip-chip assemblies are fabricated using superconducting and semiconductor materials in known semiconductor fabrication techniques. An LTD generally uses one or more layers of different materials to implement the device properties and function. A layer of material can be superconductive, conductive, semi-conductive, insulating, resistive, inductive, capacitive, or have any number of other properties. Different layers of materials may have to be formed using different methods, given the nature of the material, the shape, size or placement of the material, other materials adjacent to the material, and many other considerations.

A Fabrication process for a semiconducting or superconducting LTDs includes dosing and other methods of depositing and/or removing materials having various electrical and/or mechanical characteristics. Superconducting devices are often planar, i.e., where the superconductor structures are fabricated on one plane. A non-planar device is a three-dimensional (3D) device where some of the structures are formed above or below a given plane of fabrication.

Some LTDs are fabricated using a flip-chip geometry. In the flip-chip geometry, a first chip (such as a non-limiting example of a qubit chip in a flip-chip quantum processor) is fabricated having a number of individual devices upon a substrate, and a second chip (such as a non-limiting example of an interposer chip) having one or more connections is fabricated on a separate substrate. Solder bumps are deposited onto chip pads on a first surface of the first chip and/or second chip, and the first chip or second chip is flipped over so that its first side faces down. The first chip and second chip are aligned and bump-bonded, so that the solder of the solder bumps complete the electrical connection of the first chip and the second chip.

Bumps of a suitable material, such as soldering material with the desired electrical, thermal, ductility, malleability, and cold welding properties in cryogenic and other operating conditions, are deposited onto chip pads on a first surface of the first chip and/or the second chip. Generally, any reference to a solder bump should be construed to include bumps made of material that satisfy these requirements.

SUMMARY

The illustrative embodiments provide a thermalization structure for cryogenic temperature devices, and a method and system of fabrication therefor. An embodiment provides thermalization structure. The embodiment includes a foil comprising a first layer of a first material. The embodiment includes a low temperature device (LTD) comprising a surface from which heat is transferred away from the LTD. The embodiment includes a coupling, wherein the coupling comprises a bond formed between the foil and the surface such that forming the bond forms a set of ridges in the foil, a ridge in the set of ridges operating to dissipate the heat. Thus, the embodiment provides a thermalization structure that avoids problems arising from mechanical mounting of heat sinks onto LTDs.

In another embodiment, the foil comprises a set of layers, the set of layers including the first layer and a second layer, the second layer. Thus, the embodiment provides a thermalization structure that can be customized to have specific thermal, mechanical and other properties.

In another embodiment, the second layer comprises a second material, and wherein the second material exhibits at least a threshold level of bonding ability with a third material on a surface of the LTD when used in a cryogenic temperature range. Thus, the embodiment provides a thermalization structure where specific layers are specialized for specific purposes.

In another embodiment, the first material exhibits less than the threshold level of bonding ability with the third material on the surface of the LTD when used in a cryogenic temperature range. Thus, the embodiment provides a thermalization structure where less than an entirety of the structure can have a desired property.

In another embodiment, the first material exhibits at least a threshold level of thermal conductivity when used in a cryogenic temperature range. Thus, the embodiment provides a thermalization structure where a layer can be customized to have a desired thermal property.

In another embodiment, the first material exhibits at least a threshold level of bonding ability with a third material on a surface of a device when used in a cryogenic temperature range. Thus, the embodiment provides a thermalization structure where a layer can be customized to have a desired adhesion property.

Another embodiment further includes a pattern in the foil, wherein the pattern comprises a three-dimensional protrusion on the foil. Thus, the embodiment provides a thermalization structure where the structure can be configured to match a shape or pattern of the LTD or a component thereof.

Another embodiment further includes a pattern in the foil, wherein the pattern comprises a three-dimensional recess in the foil. Thus, the embodiment provides a thermalization structure where the structure can be configured to match a shape or pattern of the LTD or a component thereof.

Another embodiment further includes a second foil, wherein the foil and the second foil are both coupled to the LTD. Thus, the embodiment provides a thermalization structure that can be formed in sections.

Another embodiment further includes a second LTD, wherein the foil is coupled to the LTD and the second LTD. Thus, the embodiment provides a thermalization structure that can simultaneously thermalize multiple LTDs.

In another embodiment, the coupling between the foil and the surface of the LTD is a removable bond, such that the foil is detachable from the LTD after the foil has been coupled to the LTD. Thus, the embodiment provides a thermalization structure that can be removed from the LTD, e.g., for reconfiguration.

Another embodiment further includes a second foil, wherein the second foil is coupled to the foil on a side of the foil that is different from a second side that is coupled to the surface of the LTD. Thus, the embodiment provides a thermalization structure where the structure is stackable.

In another embodiment, the forming the bond further forms a set of pockets, a pocket being formed under the ridge, the pocket causing the foil to operate as an absorber of a mechanical force applied to the LTD. Thus, the embodiment provides a thermalization structure where the structure also acts as a mechanical absorber of shocks or force.

In another embodiment, the coupling is formed as a thermosonic weld. Thus, the embodiment provides a specific method for forming a bond in the thermalization structure.

In another embodiment, the coupling is formed as a laser weld. Thus, the embodiment provides a specific method for forming a bond in the thermalization structure.

In another embodiment, the coupling is formed as a thermocompression weld. Thus, the embodiment provides a specific method for forming a bond in the thermalization structure.

In another embodiment, the coupling is formed as a set of tacks, a tack in the set of tacks shaped as a spot tack. Thus, the embodiment provides a specific method for forming a bond in the thermalization structure.

In another embodiment, the coupling is formed as a set of tacks, a tack in the set of tacks shaped as a line tack. Thus, the embodiment provides a specific method for forming a bond in the thermalization structure.

In another embodiment, the coupling is formed as a set of tacks, a tack in the set of tacks shaped in a pattern. Thus, the embodiment provides a specific method for forming a bond in the thermalization structure.

An embodiment provides a computer-implemented method of fabricating a thermalization structure.

An embodiment provides a superconducting flip-chip device that can be formed using a thermalization structure disclosed herein.

An embodiment provides a quantum data processing system that can be formed using a thermalization structure disclosed herein.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
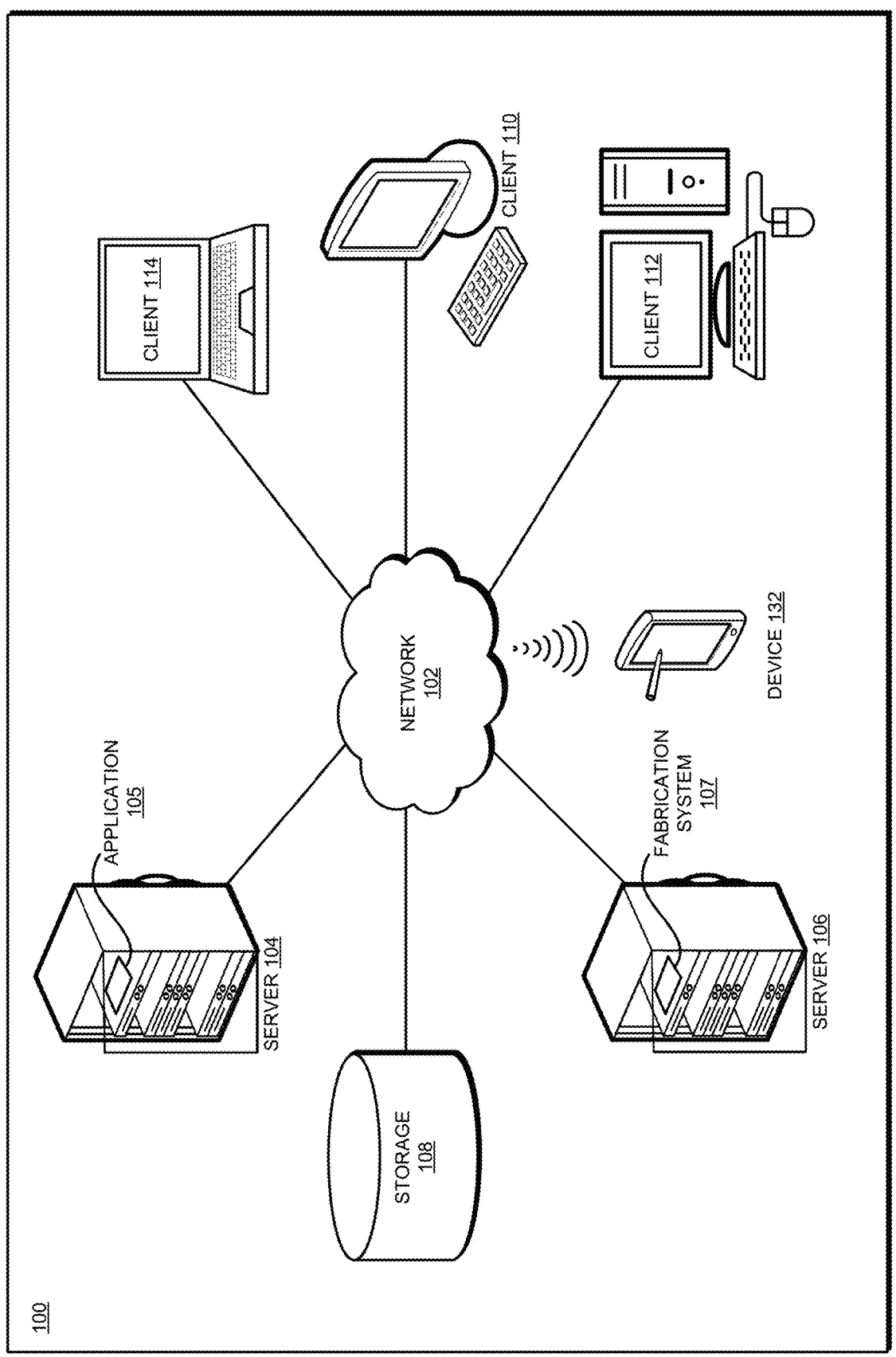
FIG. 1 depicts a block diagram of a network of data processing systems in which illustrative embodiments may be implemented.

The illustrative embodiments used to describe the invention generally address and solve the above-described problems or needs and other related problems or needs by providing a thermalization structure for cryogenic temperature devices. The illustrative embodiments also provide a method and system for fabricating the thermalization structure for cryogenic temperature devices, and a quantum processor formed using the described thermalization structure for cryogenic temperature devices.

An embodiment forms a foil using one or more materials that exhibit good thermal conductivity in the cryogenic temperature range. In one embodiment, the foil comprises a single material, e.g., copper. In another, the foil comprises more than on material, e.g., copper, platinum, gold, titanium, or some combination of these and/or other suitable materials. When multiple materials are used to form the foil, an embodiment forms a layer of one material over another layer of another material. The illustrative embodiments do not restrict the number of layers of a material, the total number of layers, the arrangement of the layers relative to one another, adjacency of materials in the foil, or the order of layers, in the formation of the described foil. Different implementations may benefit from different materials and layers in the foil of an embodiment, and such variations are contemplated within the scope of the illustrative embodiments.

An embodiment bonds the foil to a surface of a LTD. One embodiment bonds the foil to the surface of the LTD in a non-continuous fashion, i.e., only some spots on the foil are bonded to the surface while other spots on the foil are left unbonded to the surface. Such a manner of spot bonding, or "tacking" (i.e., using spot bonds, or "tacks") yields a structure comprising the foil with a ridged or wrinkled surface on the side of the foil that is opposite the side facing the surface. The wrinkled surface of the foil facilitates an increase in the lateral compliance of the foil relative to the chip. In one embodiment, the wrinkles can be formed into the foil prior to the foil being tacked to the surface of the LTD. For example, a pre-formed mold or pattern can be used to shape the foil into an egg-crate or some other shape with ridges, and the shaped foil then tacked to the surface of the LTD.

Such a manner of pre-shaping the foil may allow a greater degree of control over the shapes, sizes, positions, or some combination thereof, of the wrinkles as compared to the wrinkles formed as a consequence of the tacking process alone. Forming the wrinkles by tacking alone omits the extra pre-shaping step but may not afford as much control over the wrinkle geometry.

The wrinkled surface forms pockets under the ridges. These pockets of the pliable foil material(s) deform and act as shock absorbers when any physical force is applied to the foil-clad LTD, and dissipate a majority of the force without permitting the force to deform the cold weld material. In one embodiment, the deformation of the pocket is reversible when the applied force is removed.

Another embodiment continuously bonds a length of the foil to the surface of the LTD, but not the entirety of the foil to the entirety of the surface of the LTD. In other words, instead of spot bonding, the embodiment performs line bonding where instead of tacks, lines are formed where the foil joins the surface of the LTD. Such a manner of bonding still results in a ridged or wrinkled surface on the side of the foil that is opposite the side facing the surface. The wrinkled surface of the foil produced in this manner also facilitates an increase in the surface area of the foil that is available for heat dissipation.

These examples of spots and lines manner of non-continuous bonding are not intended to be limiting. From this disclosure, those of ordinary skill in the art will be able to conceive many other manners of non-continuous bonding and the same are contemplated within the scope of the illustrative embodiments. For example, an implementation can employ a zig-zag pattern, a random pattern, or a combination pattern of different shapes and sizes for bonding the foil to the surface without departing the scope of the illustrative embodiments. Only for the clarity of the description and without implying any limitation thereto, spot bonding, or tacking, will be used as a non-limiting example method of bonding the foil to the surface of the LTD, when describing an embodiment or feature in this disclosure.

A variety of methods of bonding are usable with the illustrative embodiments. For example, one embodiment uses a thermosonic welding technique to form the tacks. Thermosonic welding does not require any global heating of the substrate, rather, ultrasonic energy is focused with a tip onto a spot on the foil to cause a spot bond at that point. Negligible mechanical force, if any, is experienced by the foil or the LTD in this process, thereby avoiding any solder creep described earlier. The shape, size, position, and ultrasonic force and power are controllable and configurable by varying the tip used in the thermosonic welding tool.

Another embodiment uses a laser welding technique to form the tacks. Laser welding also does not require any global heating of the substrate, rather, laser energy is focused onto a spot on the foil to locally heat the spot and cause a spot bond at that point. Negligible mechanical force, if any, is experienced by the foil or the LTD in this process, thereby avoiding any solder creep described earlier. The shape, size, position, and power are controllable and configurable by varying the direct write pattern used for the welding.

Other methods of spot bonding include but are not limited to solder reflow or thermocompression. Some methods, such as thermocompression require slightly more mechanical compressive force than, e.g., thermosonic or laser welding, but the bump bond solder creep can be controlled in thermocompression with reflow. The size and location of the spot bonding can be selected in such methods according to the under bump metal layer geometry or the bump geometry in the LTD. Furthermore, any of the described method or other methods can be used in combination, in parallel at several spots at once, or sequentially within the scope of the illustrative embodiments.

A single foil can span multiple LTDs. A single LTD can span multiple foils. Different foils can be of different thicknesses, layer compositions, or both. For example, a foil can include an adhesion layer, a wettable layer, a non oxidizable layer, a barrier layer, and a superconductor layer arranged in a suitable order and numerosity. A foil can be spot bonded to a package, i.e., the hard plastic or laminate that encapsulates the semiconductor/superconductor circuitry.

A foil can be formed using flat or pattern-less layer or layers. One, some, or all layers of a foil can be patterned to include three dimensional structures, including protrusions, recesses, or both. A foil can be temporarily attached to an LTD using a removable spot bonding method and material. Not all layers of a foil need be bondable materials as long as the layer facing the surface of the LTD to which the foil is to be bonded comprises a material that exhibits bonding properties with the material of the LTD surface. A first foil can be tacked to a surface of an LTD, and a second foil can be tacked to the first foil, and a buildup of a plurality of foils can be formed under certain circumstances. The LTD contemplated herein can be an electronic structure on or in a substrate, the substrate, or a combination thereof, as long as a surface on which the foil is to be tacked is capable of accepting the spot bonding with the foil.

A fabrication method for fabricating a flip-chip quantum computing device of an embodiment can be implemented as a software application. The application implementing a fabrication method can be configured to operate in conjunction with an existing superconducting fabrication system— such as a lithography system.

Only, for the clarity of the description, and without implying any limitation thereto, the illustrative embodiments are described using an example number of components on a chip in an example LTD. An embodiment can be implemented with any number, type, or combination of LTDs or LTD components, including but not limited to qubit chips, interposer chips, quantum processors in flip-chip arrangement, and other semiconducting or superconducting devices.

Furthermore, a simplified diagram of the non-limiting example flip-chip geometry is used in the figures and the illustrative embodiments. In an actual fabrication of a flip-chip, additional structures that are not shown or described herein, or structures different from those shown and described herein, may be present without departing the scope of the illustrative embodiments. Similarly, within the scope of the illustrative embodiments, a shown or described structure in the example flip-chip may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, numerosity, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical semiconducting or superconducting device, e.g., a qubit that is presently viable, only as an example. The steps described by the various illustrative embodiments can be adapted for fabricating a variety of LTDs in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, thermal properties, mechanical properties, structures, formations, shapes, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to the figures and in particular with reference to FIG. 1, this figure depicts an example diagram of a data processing environment in which a method of the illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is a software component of any suitable system for fabricating a LTD, such as a Josephson junction, a qubit, and other superconducting structures used in quantum computing devices. Generally, fabrication systems and their corresponding software components for manufacturing LTDs, including devices for quantum computing usage, are known. Application 105 provides instructions to such a known fabrication system via fabrication application 107 for causing the assembly of a novel thermalization structure for cryogenic temperature devices contemplated in the illustrative embodiments, in a manner described herein.

Figure 2:
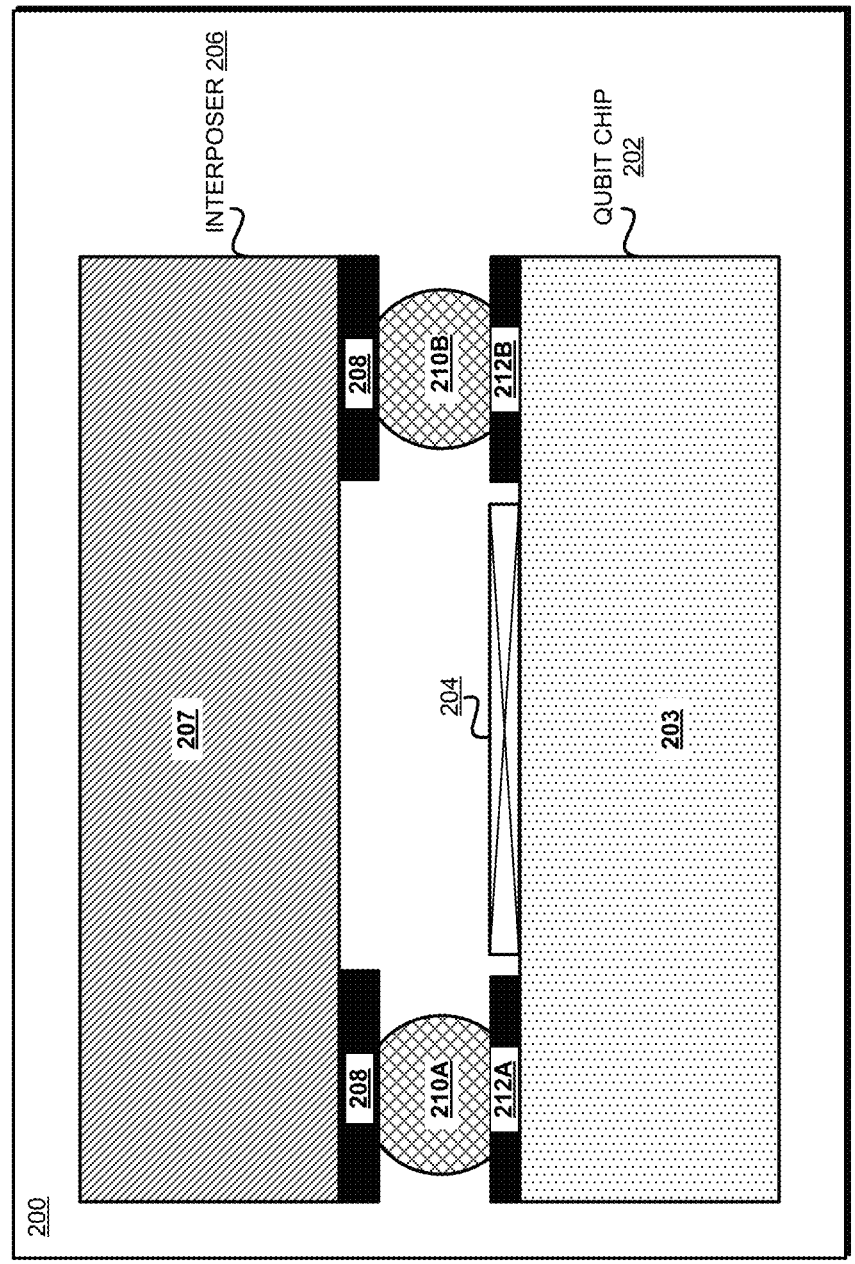
FIG. 2 depicts a cross-section view of a non-limiting flip-chip quantum computing device illustrating a problem that can be solved using an illustrative embodiment.

With reference to FIG. 2, this figure depicts a cross-section view of a non-limiting flip-chip quantum computing device illustrating a problem that can be solved using an illustrative embodiment. Flip-chip quantum computing device 200 includes qubit-chip 202 having substrate 203. Substrate 203 is selected to be a suitable material on which Josephson junctions can be formed, and eventually the material is suitable for forming qubits using the Josephson junctions. Substrate 203 includes Josephson junction 204 formed on a first surface of substrate 203.

Substrate 203 comprises a material, which when operating in a cryogenic temperature range, exhibits a Residual Resistance Ratio (RRR) of at least 100, and a thermal conductivity of greater than a 1 W/(cm*K) at 4 Kelvin. RRR is the ratio of the resistivity of a material at room temperature and at 0 K. Because 0 K cannot be reached in practice, an approximation at 4 K is used. For example, substrate 203 may be formed using sapphire, silicon, quartz, gallium arsenide, fused silica, amorphous silicon, or diamond for operations in the temperature range of 77 K to 0.01K.

Flip-chip quantum computing device 200 further includes interposer chip 206 including interposer substrate 207. Interposer substrate 207 comprises a material that exhibits an RRR of at least 100, and a thermal conductivity of greater than a 1 W/(cm*K) at 4 Kelvin. In a particular embodiment, one or more of substrate 203 and interposer substrate 207 are formed of silicon or another suitable substrate material. These examples of substrate materials are not intended to be limiting. From this disclosure those of ordinary skill in the art will be able to conceive of many other materials suitable for forming substrate 203 and/or substrate 207, and the same are contemplated within the scope of the illustrative embodiments.

Interposer chip 206 includes connection points (pads) 208 formed on the first surface of interposer substrate 207. In a particular embodiment, pad 208 is formed of a superconductive material, multiple superconductive materials, a metal material, or a combination thereof.

Qubit-chip 202 includes contact pads 212A and 212B formed on the first surface of substrate 203. In a particular embodiment, contact pads 212A-B are formed of a superconductive material, multiple superconductive materials, a metal material, or a combination thereof.

Pads 208 of interposer chip 206 are bonded to qubit-chip 202 by first bump bond 210A and second bump bond 210B. In some embodiments, a single bump bond, or more than one bump bonds may also be used to bond a pad 208 of interposer 206 with a pad of qubit-chip 202. Bonding forms an electrical connection between interposer chip 206 and qubit-chip 202 through first bump bond 210A and contact pad 212A, and through second bump bond 210B and contact pad 212B. In an embodiment, pads 208 and pad 212A-B are formed using at least one of Aluminum, Niobium, Titanium, Titanium Nitride, Palladium, Gold, Silver, Copper, or Platinum for operations in the temperature range of 77 K to 0.01K. In an embodiment, bump bonds 210A, 210B are formed using Indium, Tin, and alloys of Bismuth for operations in the temperature range of 77 K to 0.01K. These examples of substrate materials, bump bond materials and landing pad materials are not intended to be limiting. From this disclosure those of ordinary skill in the art will be able to conceive of many other materials suitable for forming these structures and the same are contemplated within the scope of the illustrative embodiments.

Where the qubit resonance frequencies are a function of a separation gap distance between the interposer chip and the qubit-chip, the design/fabrication system also determines a suitable separation gap distance between the interposer chip and the qubit-chip based upon the desired frequency adjustment, frequency tuning range, and sensitivity. The design/fabrication system bonds the interposer chip and qubit-chip at the separation gap distance to achieve the desired qubit frequencies in the flip-chip arrangement. The design/fabrication system bonds the interposer chip and qubit-chip using a bump bond process or other suitable methods of bonding the flip-chip assembly.

Figure 3:
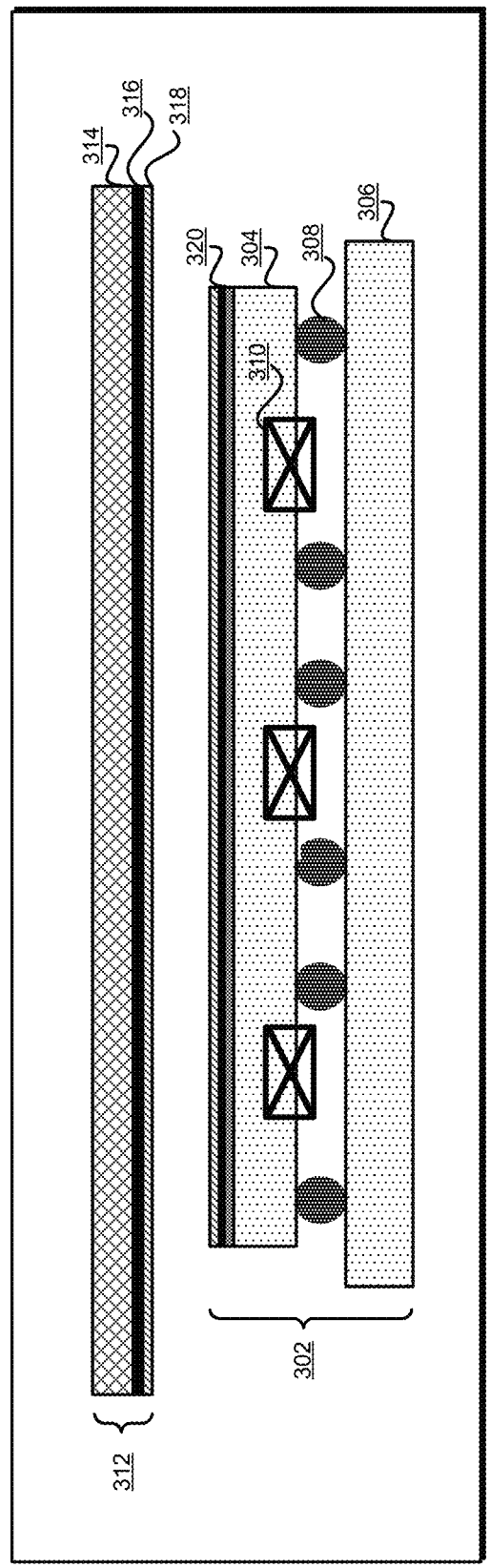
FIG. 3 depicts a step in an example process of forming a thermalization structure in accordance with an illustrative embodiment.

With reference to FIG. 3, this figure depicts a step in an example process of forming a thermalization structure in accordance with an illustrative embodiment. A non-limiting example of an LTD, flip-chip 302, comprises qubit chip 304 and interposer chip 306. Qubit chip 304 and interposer chip 306 are cold welded together as shown using solder material 308. Qubit chip 304 comprises a plurality of qubits 310, and interposer chip 306 comprises readout circuit (not shown) disposed relative to qubits 310.

An embodiment constructs foil 312 using one or more layers of one or more materials as described herein. In the depicted non-limiting example, foil 312 comprises layers 314, 316, and 318 disposed relative to one another to satisfy certain thermalization requirements. For example, one thermalization requirement may be that layer 318 of foil 312 should be able to spot bond with layer 320 on a surface of chip 304 (when foil 312 is sought to be attached to chip 304 in flip-chip assembly 302). Foil 312 can be attached to chip 306 in flip-chip assembly 302 in a similar manner.

Figure 4:
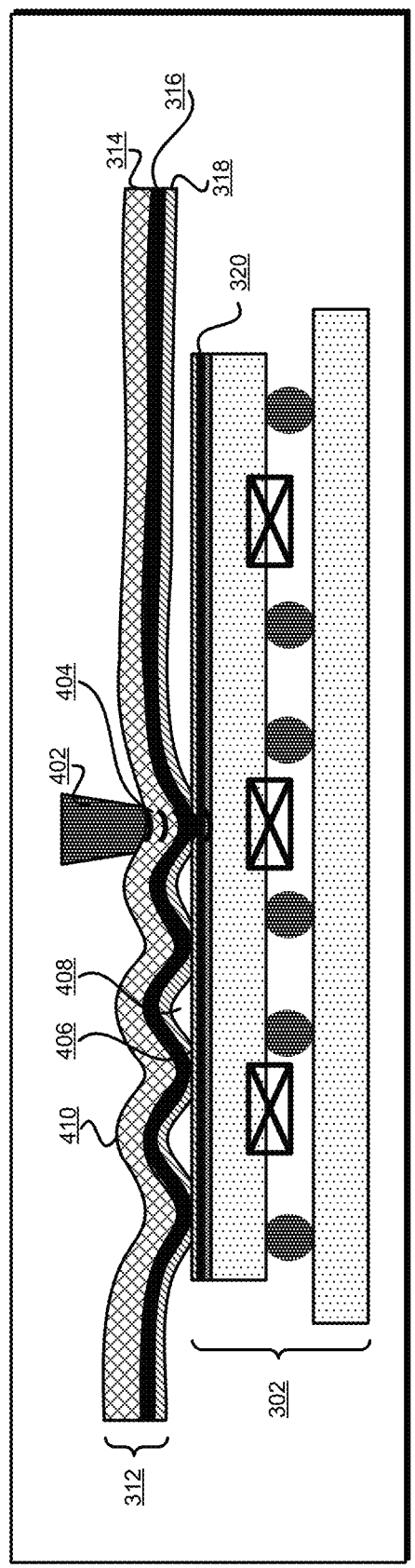
FIG. 4 depicts another step in an example process of forming a thermalization structure in accordance with an illustrative embodiment.

With reference to FIG. 4, this figure depicts another step in an example process of forming a thermalization structure in accordance with an illustrative embodiment. Reference numerals common to FIGS. 3 and 4 represent the same or similar artifacts as described with respect to FIG. 3.

A non-limiting example method of thermosonic welding is depicted to tack foil 312 to surface 320 of LTD 302. Tip 402 focuses ultrasonic energy 404 at spots similar to spot 406, forming a spot bond at spot 406. Pockets 408, as described herein, are formed between spots 406. Ridges 410, as described herein, are also formed between spots 406 as a result of the tacking operation.

Figure 5:
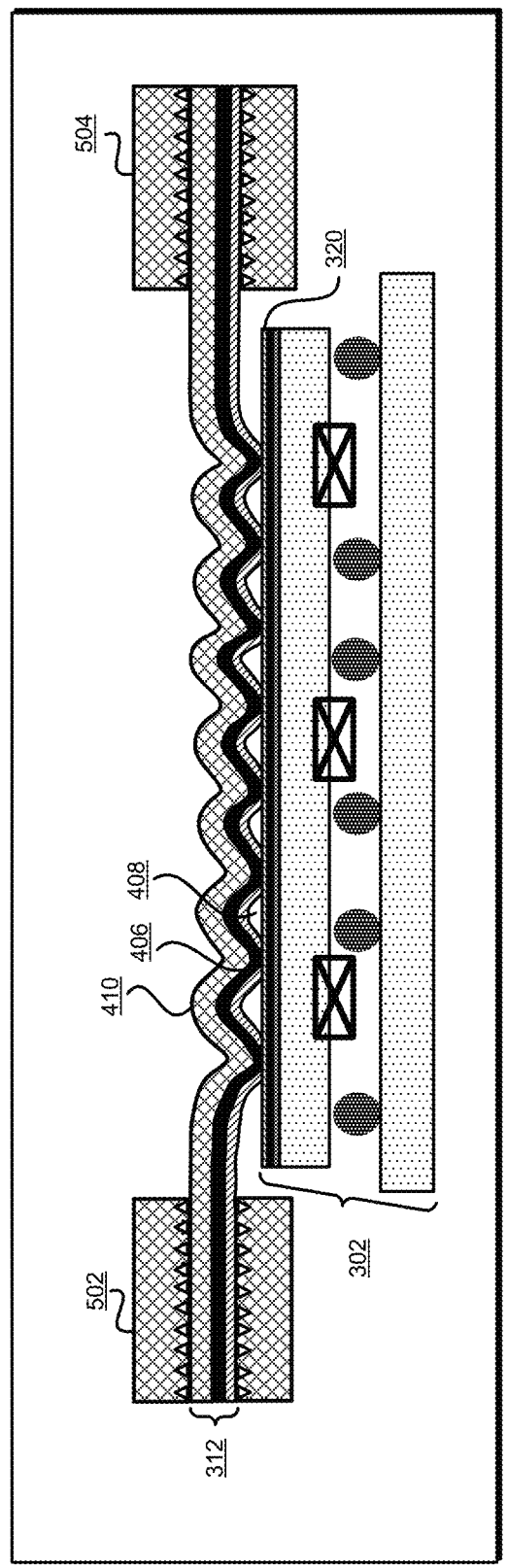
FIG. 5 depicts another step in an example process of forming a thermalization structure in accordance with an illustrative embodiment.

With reference to FIG. 5, this figure depicts another step in an example process of forming a thermalization structure in accordance with an illustrative embodiment. Reference numerals common to FIGS. 3, 4, and 5 represent the same or similar artifacts as described with respect to FIGS. 3 and 4.

Using any of the tacking methods described herein, an embodiment forms a set of more than one tacks 406, a set of one or more pockets 408, and a set of one or more ridges 410 are formed using foil 312 and surface 320 of LTD 302. An embodiment thermally couples the tacked foil 312 to one or more external structure, e.g., structure 502 and/or structure 504. In one embodiment, structure 502 (and/or structure 504) is physically and thermally conductively coupled to foil 312 to cause a transfer of heat energy from (or to, if needed) foil 312 to (or from) structure 502 (and/or 504). In another embodiment, structure 502 (and/or structure 504) is physically and thermally conductively coupled to foil 312 to further impart mechanical stability or rigidity to the placement of the combination of foil 312 and LTD 302. In another embodiment, structure 502 (and/or 504) couple to foil 312 in a detachable manner. In another embodiment, the detachable coupling between structure 502 (and/or 504) and foil 312 is performed only with a compressive force on a section of foil 312 that is at a clearance distance from LTD 302. In another embodiment, the detachable coupling between structure 502 (and/or 504) and foil 312 is performed using a detachable adhesive material on a section of foil 312 that is at a clearance distance from LTD 302. In one embodiment, structure 502 (and/or 504) is a portion of, or is coupled to, or performs as, a heat sink that is not directly mounted on LTD 302.

Figure 6:
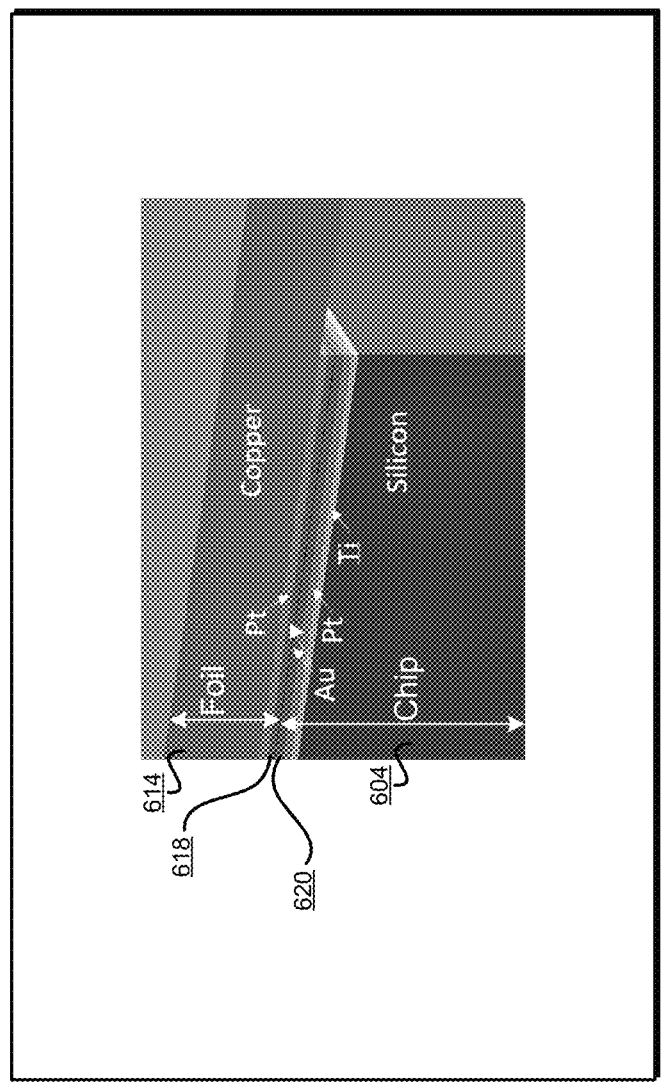
FIG. 6 depicts an example structure of an example foil in accordance with an illustrative embodiment.

With reference to FIG. 6, this figure depicts an example structure of an example foil in accordance with an illustrative embodiment. Foil 612 is similar to foil 312 as described with respect to FIG. 3, and is usable in the manner described with respect to FIGS. 4 and 5.

Foil 612 comprises one or more of layer 614, which is similar to layer 314 in FIGS. 3-5. In the depicted example, layer 614 is formed using copper because of copper's desirable thermal conductivity at cryogenic temperatures. Foil 612 further comprises one or more of layer 618, which is similar to layer 318 in FIGS. 3-5. Layer 618 is formed using gold because of gold's desirable resistance to oxidation prior to assembly.

Substrate 604 is similar to substrate 304 of LTD 302 in FIGS. 3-5. In the depicted example, substrate 604 is formed using silicon. Layer 614 is similar to layer 314 of foil 312 in FIGS. 3-5. Layer 618 is similar to layer 318 of foil 312 in FIGS. 3-5. Layer 620 is similar to layer 320 of LTD 302 in FIGS. 3-5. In the depicted non-limiting example, layer 620 is formed using gold for gold's desirable quality of ability to spot bond with gold of layer 618. Gold is a known good cryogenic thermal conductor and helps to spread the heat laterally in accordance with the illustrative embodiments.

In one embodiment, a barrier/wetting layer (e.g., platinum or palladium) is formed as shown between the bonding gold layer and the substrate. As one of its functions, this barrier layer prevents gold from poisoning the silicon and it also ensure the gold does not de-wet during ultrasonic bonding.

Another embodiment also adds an adhesion layer under the wetting/barrier layer. Titanium is a known good adhesion material for this layer. This layer not only acts as an adhesion layer between the silicon and the wetting layer, but it is also a thin super conductor. The thin super conductor impedes the heat transfer up to an acceptable tolerance but in exchange for that acceptable loss in heat transfer, the adhesion layer provides a benefit of isolating the active side from the lossy thermalization metals. Titanium formed as an adhesion layer of an optimal thickness can deliver this trade-off when the thickness of the It layer is above a first threshold thickness that it is superconducting but below a second thinness threshold so that it only impacts the heat transfer up to an acceptable tolerance.

Figure 7:
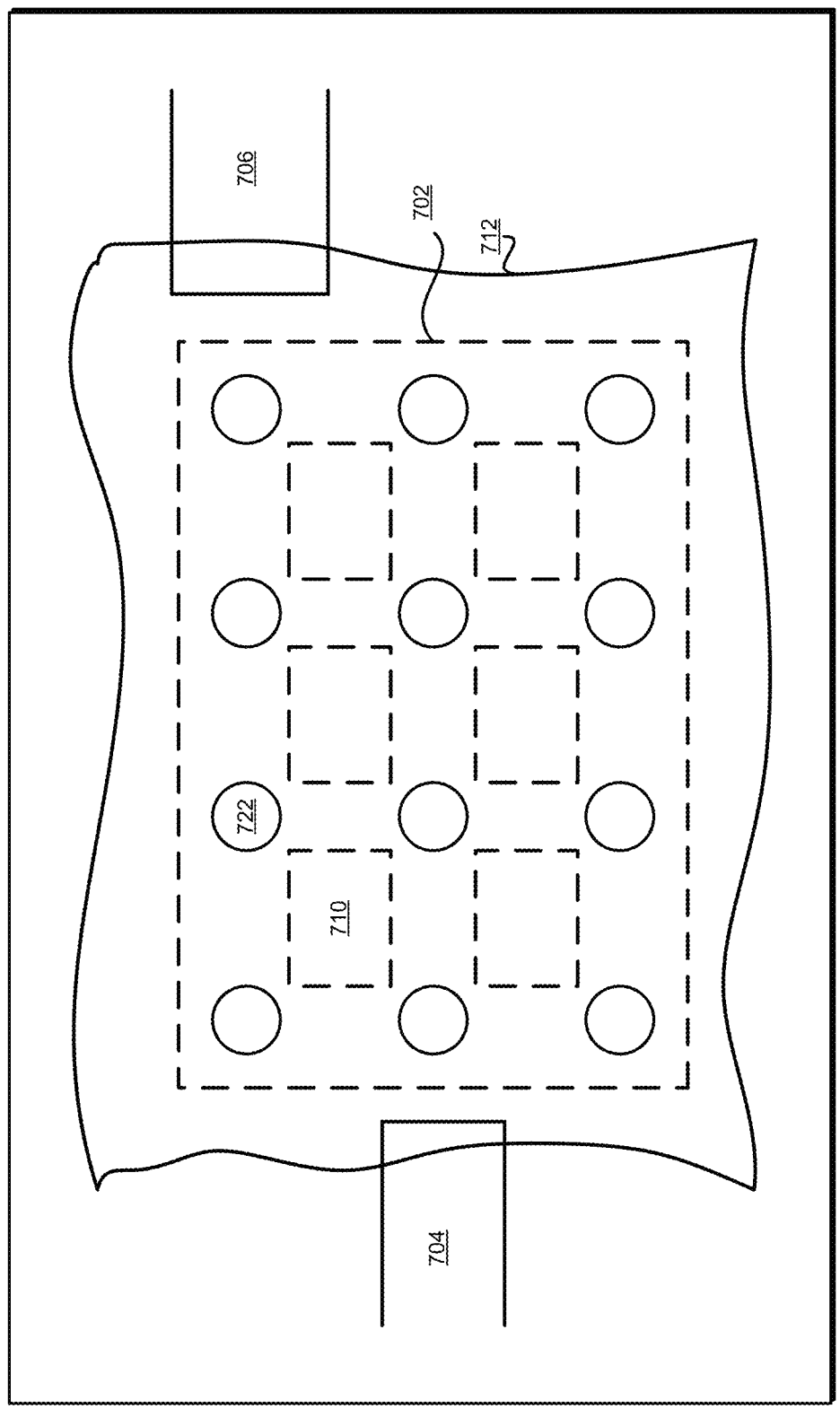
FIG. 7 depicts an example schematic diagram of a foil-tacked LTD device in accordance with an illustrative embodiment.

With reference to FIG. 7, this figure depicts an example schematic diagram of a foil-tacked LTD device in accordance with an illustrative embodiment. Example foil 712 a foil as described herein. LTD 702 can be any LTD described herein, including but not limited to LTD 302 in FIG. 3. Components 710 can be any component formed in LTD 302, including but not limited to qubits 310 in FIG. 3. Structures 704 and 706 are similar to structure 502 and 504 in FIG. 5.

In this example depiction, foil 712 is tacked to LTD 702 by forming spot bonds in the manner of spot tacks 722. One or more ridge and pocket exist and operate, as described herein, between different instances of spot tacks 722.

Figure 8:
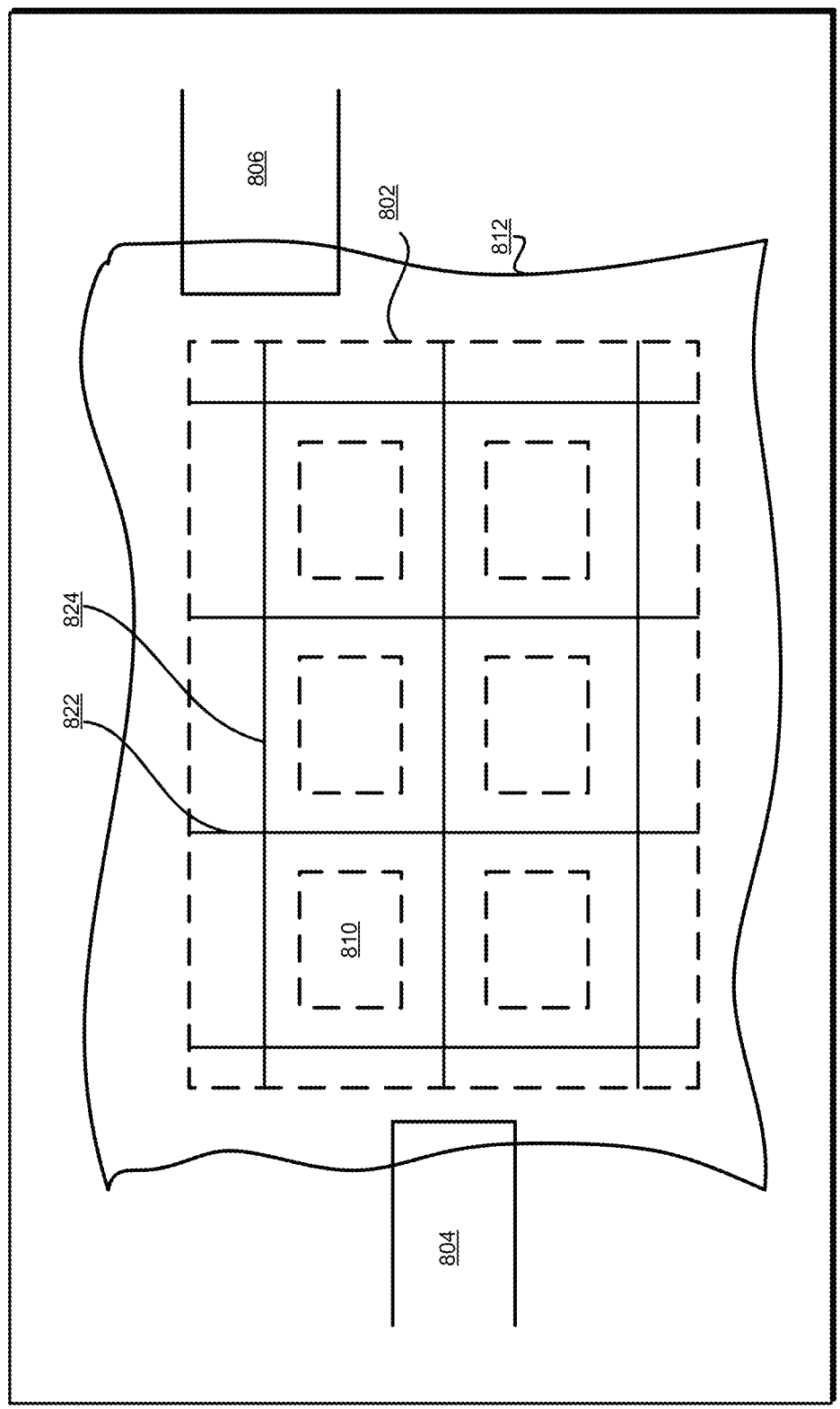
FIG. 8 depicts another example schematic diagram of a foil-tacked LTD device in accordance with an illustrative embodiment.

With reference to FIG. 8, this figure depicts another example schematic diagram of a foil-tacked LTD device in accordance with an illustrative embodiment. Example foil 812 a foil as described herein. LTD 802 can be any LTD described herein, including but not limited to LTD 302 in FIG. 3. Components 810 can be any component formed in LTD 302, including but not limited to qubits 310 in FIG. 3. Structures 804 and 806 are similar to structure 502 and 504 in FIG. 5.

In this example depiction, foil 812 is tacked to LTD 802 by forming line bonds in the manner of line tacks 822. In one embodiment, the line tacks can run in different direction on foil 812. For example, line tacks 824 intersect with line tacks 822. One or more ridge and pocket exist and operate, as described herein, between different instances of line tacks 822 alone, or between line tacks 822 and 824.

Figure 9:
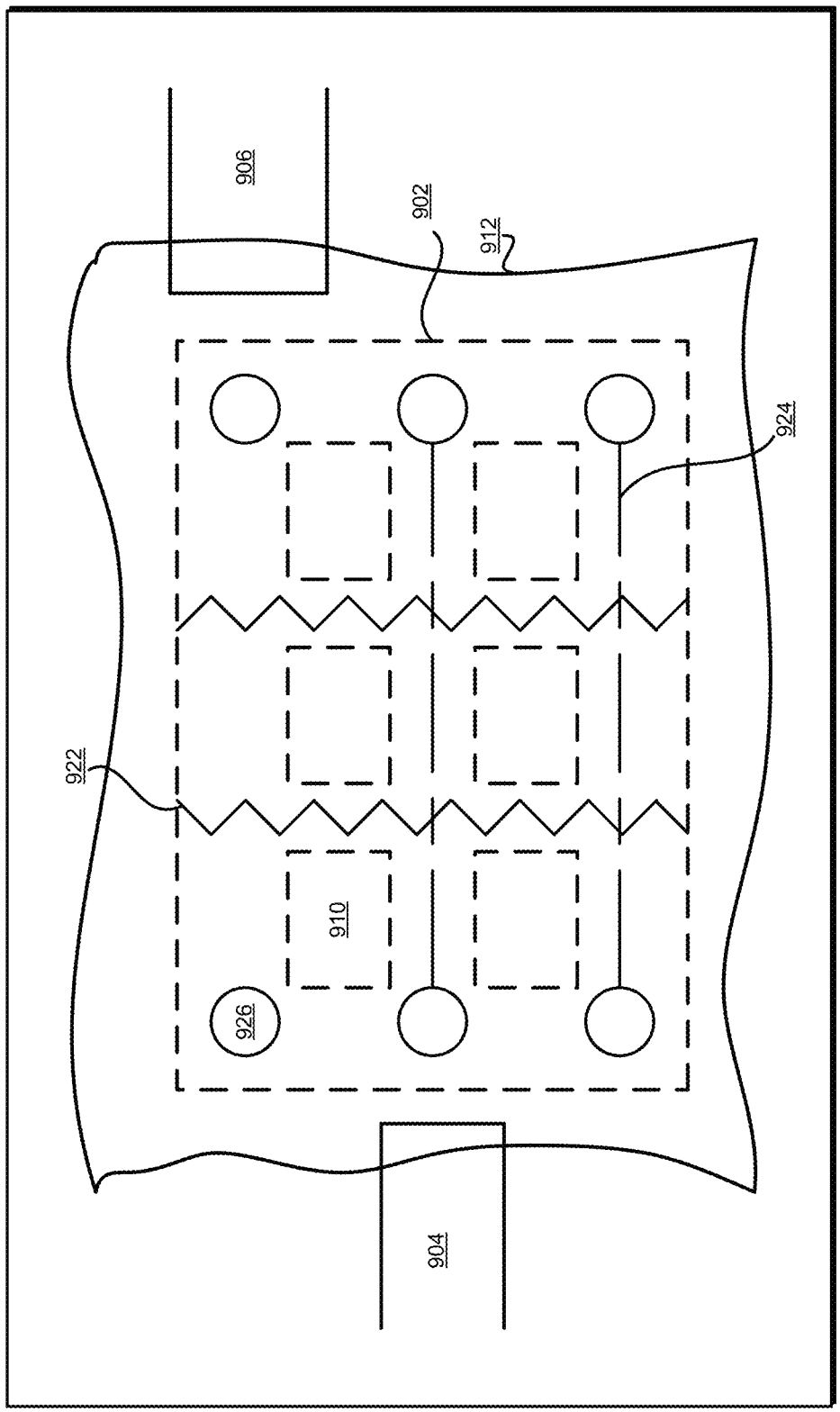
FIG. 9 depicts another example schematic diagram of a foil-tacked LTD device in accordance with an illustrative embodiment.

With reference to FIG. 9, this figure depicts another example schematic diagram of a foil-tacked LTD device in accordance with an illustrative embodiment. Example foil 912 a foil as described herein. LTD 902 can be any LTD described herein, including but not limited to LTD 302 in FIG. 3. Components 910 can be any component formed in LTD 302, including but not limited to qubits 310 in FIG. 3. Structures 904 and 906 are similar to structure 502 and 504 in FIG. 5.

In this example depiction, foil 912 is tacked to LTD 902 by forming bonds of a variety of shapes in combination, and in a variety of locations and directions. As a non-limiting example, in one embodiment, foil 912 is tacked to LTD 902 using a combination of spot tacks 926, line tacks 924, and random or geometric patterned tacks 922, wherein any of the tacks in the combination can be positioned in a place and direction independent of other tacks on foil 912. Furthermore, different tacks can be formed using different tacking methods described herein. One or more ridge and pocket exist and operate, as described herein, between different instances of tacks 922, 924, and 926.

Figure 10:
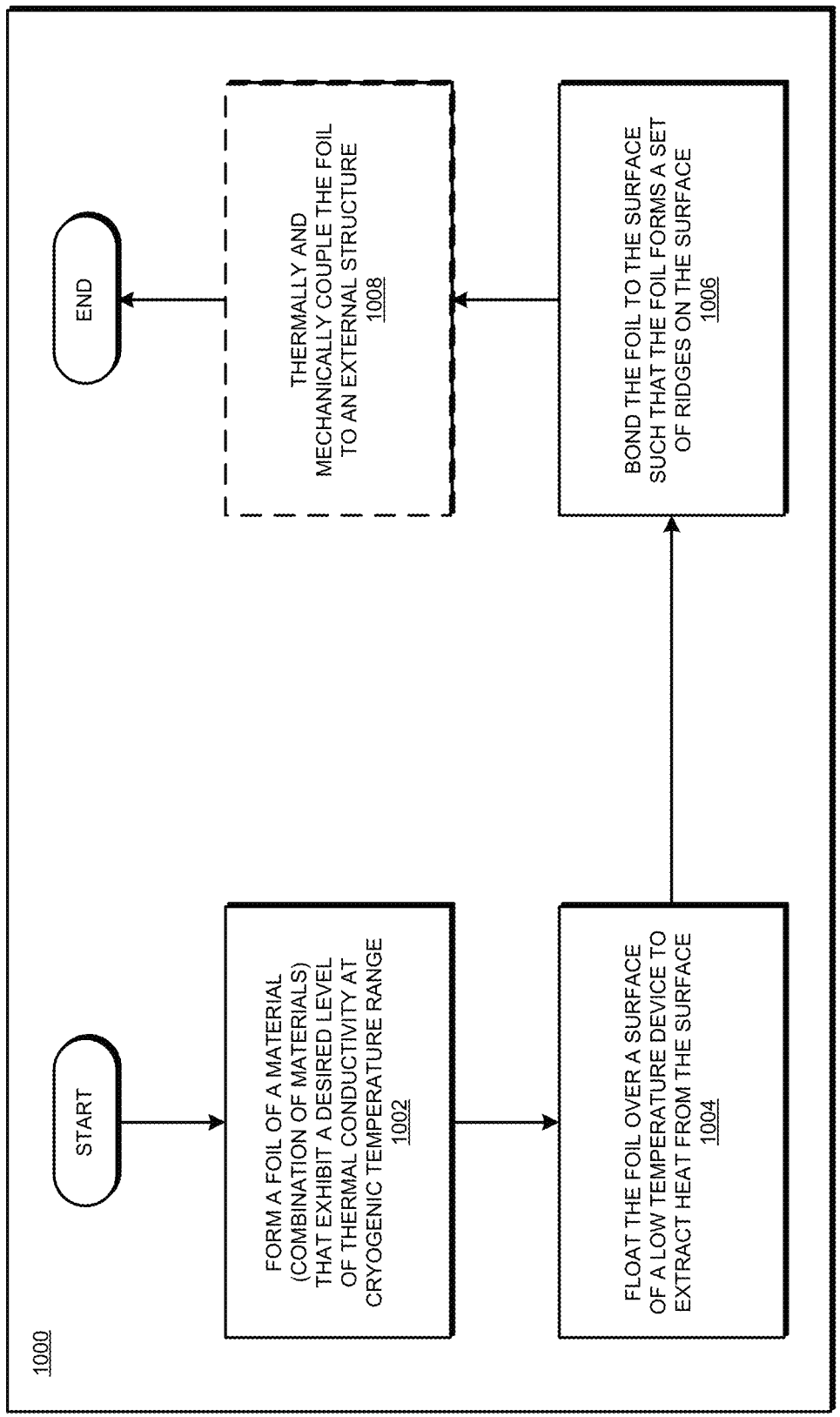
FIG. 10 depicts a flowchart of an example process for forming a thermalization structure for cryogenic temperature devices in accordance with an illustrative embodiment.

With reference to FIG. 10, this figure depicts a flowchart of an example process for forming a thermalization structure for cryogenic temperature devices in accordance with an illustrative embodiment. Process 1000 can be implemented in application 105 of FIG. 1, to form a foil-tacked LTD in a manner described herein.

The application forms, or causes to be formed, a foil of a material, or a combination of materials, that exhibit a desired level of thermal conductivity while operating in a cryogenic temperature range (block 1002). The application floats, suspends, or otherwise maneuvers the foil into a position relative to a surface of a LTD from which heat energy is to be extracted (block 1004). The floating or suspending of the foil is performed in a manner that when the foil is tacked to the surface, a pocket as described herein can form. In some cases, the floating or suspending the foil occurs at a distance relative to the surface of the LTD. In another case, the foil can be floated by loosely placing the foil on the surface of the LTD such that the foil is not affixed or bonded to the surface absent any tacks described herein.

The application bonds, or causes to be bonded, the foil to the surface, e.g., using a set of tacks, such that a set of ridges are formed on a surface of the foil (block 1006). In some cases, the application ends process 1000 thereafter, such as when the ridged and tacked foil is sufficient to dissipate the heat produced by the LTD without needed any further coupling to a heat sink or a stabilizer. Optionally, when an external non-mounted heat sink has to be used with the foil-tacked LTD, when the foil-LTD assembly has to be physically stabilized in a position, or both, the application thermally and mechanically couples a section of the foil to an external structure (block 1008). The application ends process 1000 thereafter.

Various embodiments of the present invention are described herein with reference to the related drawings. Alternative embodiments can be devised without departing from the scope of this invention. Although various connections and positional relationships (e.g., top, bottom, over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A thermalization structure, comprising:
   a foil comprising a first layer of a first material;
   a low temperature device (LTD) comprising a surface from which heat is transferred away from the LTD; and
   a coupling, wherein the coupling comprises a bond formed between the foil and the surface such that forming the bond forms a set of linear ridges in the foil, a ridge in the set of linear ridges operating to dissipate the heat.

2. The thermalization structure of claim 1, wherein the foil comprises a set of layers, the set of layers including the first layer and a second layer.

3. The thermalization structure of claim 2, wherein the second layer comprises a second material, and wherein the second material exhibits at least a threshold level of bonding ability with a third material on a surface of the LTD when used in a cryogenic temperature range.

4. The thermalization structure of claim 3, wherein the first material exhibits less than the threshold level of bonding ability with the third material on the surface of the LTD when used in a cryogenic temperature range.

5. The thermalization structure of claim 1, wherein the first material exhibits at least a threshold level of thermal conductivity when used in a cryogenic temperature range.

6. The thermalization structure of claim 1, wherein the first material exhibits at least a threshold level of bonding ability with a third material on a surface of a device when used in a cryogenic temperature range.

7. The thermalization structure of claim 1, further comprising:
a pattern in the foil, wherein the pattern comprises a three-dimensional protrusion on the foil.

8. The thermalization structure of claim 1, further comprising:
a pattern in the foil, wherein the pattern comprises a three-dimensional recess in the foil.

9. The thermalization structure of claim 1, further comprising:
a second foil, wherein the foil and the second foil are both coupled to the LTD.

10. The thermalization structure of claim 1, further comprising:
a second LTD, wherein the foil is coupled to the LTD and the second LTD.

11. The thermalization structure of claim 1, wherein the coupling between the foil and the surface of the LTD is a removable bond, such that the foil is detachable from the LTD after the foil has been coupled to the LTD.

12. The thermalization structure of claim 1, further comprising: a second foil, wherein the second foil is coupled to the foil on a side of the foil that is different from a second side that is coupled to the surface of the LTD.

13. The thermalization structure of claim 1, wherein the forming the bond further forms a set of pockets, a pocket being formed under the ridge, the pocket causing the foil to operate as an absorber of a mechanical force applied to the LTD.

14. The thermalization structure of claim 1, wherein the coupling is formed as a thermosonic weld.

15. The thermalization structure of claim 1, wherein the coupling is formed as a laser weld.

16. The thermalization structure of claim 1, wherein the coupling is formed as a thermocompression weld.

17. The thermalization structure of claim 1, wherein the coupling is formed as a set of tacks, a tack in the set of tacks shaped as a spot tack.

18. The thermalization structure of claim 1, wherein the coupling is formed as a set of tacks, a tack in the set of tacks shaped as a line tack.

19. The thermalization structure of claim 1, wherein the coupling is formed as a set of tacks, a tack in the set of tacks shaped in a pattern.

20. A computer-implemented method for fabricating a thermalization structure, the computer-implemented method comprising:
forming a foil comprising a first layer of a first material;
floating, over a low temperature device (LTD) comprising a surface from which heat is transferred away from the LTD, the foil; and
forming a coupling, wherein the coupling comprises a bond formed between the foil and the surface such that forming the bond forms a set of linear ridges in the foil, a ridge in the set of linear ridges operating to dissipate the heat.

21. The computer-implemented method of claim 20, wherein the foil comprises a set of layers, the set of layers including the first layer and a second layer.

22. The computer-implemented method of claim 21, wherein the second layer comprises a second material, and wherein the second material exhibits at least a threshold level of bonding ability with a third material on a surface of the LTD when used in a cryogenic temperature range.

23. A superconducting flip-chip device comprising:
a low temperature device (LTD); and
a thermalization structure, the thermalization structure comprising:
a foil comprising a first layer of a first material;
a surface of the LTD from which heat is transferred away from the LTD; and
a coupling, wherein the coupling comprises a bond formed between the foil and the surface such that forming the bond forms a set of linear ridges in the foil, a ridge in the set of linear ridges operating to dissipate the heat.

24. The superconducting flip-chip device of claim 23, further comprising:
a cold weld material that is susceptible to creep upon applying to the LTD a mechanical force greater than a threshold force, the creep causing a reduction in a separation distance configured in the flip-chip device, and wherein the coupling is formed without the mechanical force exceeding a threshold force.

25. A quantum data processing system comprising:
a quantum processor comprising a low temperature device (LTD); and
a thermalization structure, the thermalization structure comprising:
a foil comprising a first layer of a first material;
a surface of the LTD from which heat is transferred away from the LTD; and
a coupling, wherein the coupling comprises a bond formed between the foil and the surface such that forming the bond forms a set of linear ridges in the foil, a ridge in the set of linear ridges operating to dissipate the heat.

* * * * *